United States Patent [19]

Yochum

[11] 4,412,182
[45] Oct. 25, 1983

[54] APPARATUS FOR CONTROLLING AN OPERATIONAL CHARACTERISTIC OF A CONTROLLED DEVICE IN ACCORDANCE WITH THE POSITION OF A MOVABLE MEMBER

[75] Inventor: Billy G. Yochum, Quincy, Ill.

[73] Assignee: Harris Corporation, Melbourne, Fla.

[21] Appl. No.: 242,019

[22] Filed: Mar. 9, 1981

[51] Int. Cl.³ .................. H03F 17/00; G01D 5/34
[52] U.S. Cl. ........................... 330/59; 330/129;
330/308; 250/229
[58] Field of Search ............ 250/229, 231 SE, 237 G;
330/59, 127, 129, 308

[56] References Cited

U.S. PATENT DOCUMENTS

| | | | |
|---|---|---|---|
| 3,363,106 | 1/1968 | Park | 250/209 |
| 3,619,626 | 11/1971 | Rudolph | 250/219 |
| 3,755,681 | 8/1973 | Montross | 250/229 |
| 3,835,384 | 9/1974 | Liff | 325/25 |
| 3,947,692 | 3/1976 | Payne | 250/577 |
| 4,015,253 | 3/1977 | Goldstein | 340/347 |
| 4,100,420 | 7/1978 | Metcalf et al. | 250/561 |
| 4,122,395 | 10/1978 | Schotz et al. | 325/453 |
| 4,342,910 | 8/1982 | Pfeifer et al. | 250/237 G |

FOREIGN PATENT DOCUMENTS 468352  5/1975  U.S.S.R. ................. 330/59

Primary Examiner—James B. Mullins
Attorney, Agent, or Firm—Yount & Tarolli

[57] ABSTRACT

Apparatus is provided for sensing the position of a movable member, such as an audio fader control slider (42), and for controlling an operational characteristic of a controlled device (29), such as the gain of an audio amplifier (34), in accordance therewith. A position detector circuit (26) detects the location of the movable member and provides a first signal indicative thereof. A translation circuit (28) responds to the first signal to provide a second signal representing the value assigned to the position indicated by the first signal. The second signal is applied to the controlled device (29) to control its operational characteristic. The position detection circuit (26) includes elements (24, 36, 38) using radiant energy to detect the location of the movable member.

27 Claims, 9 Drawing Figures

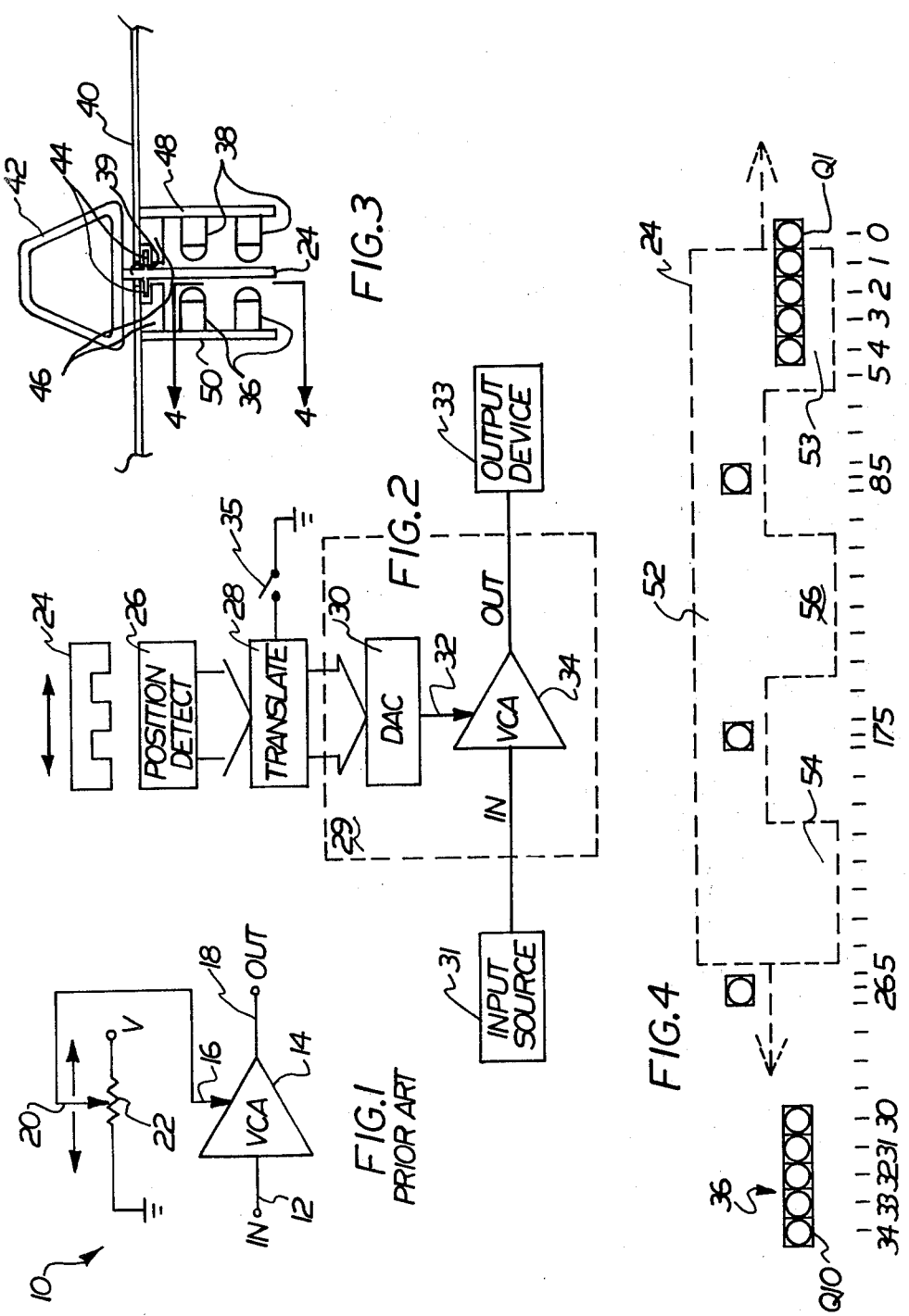

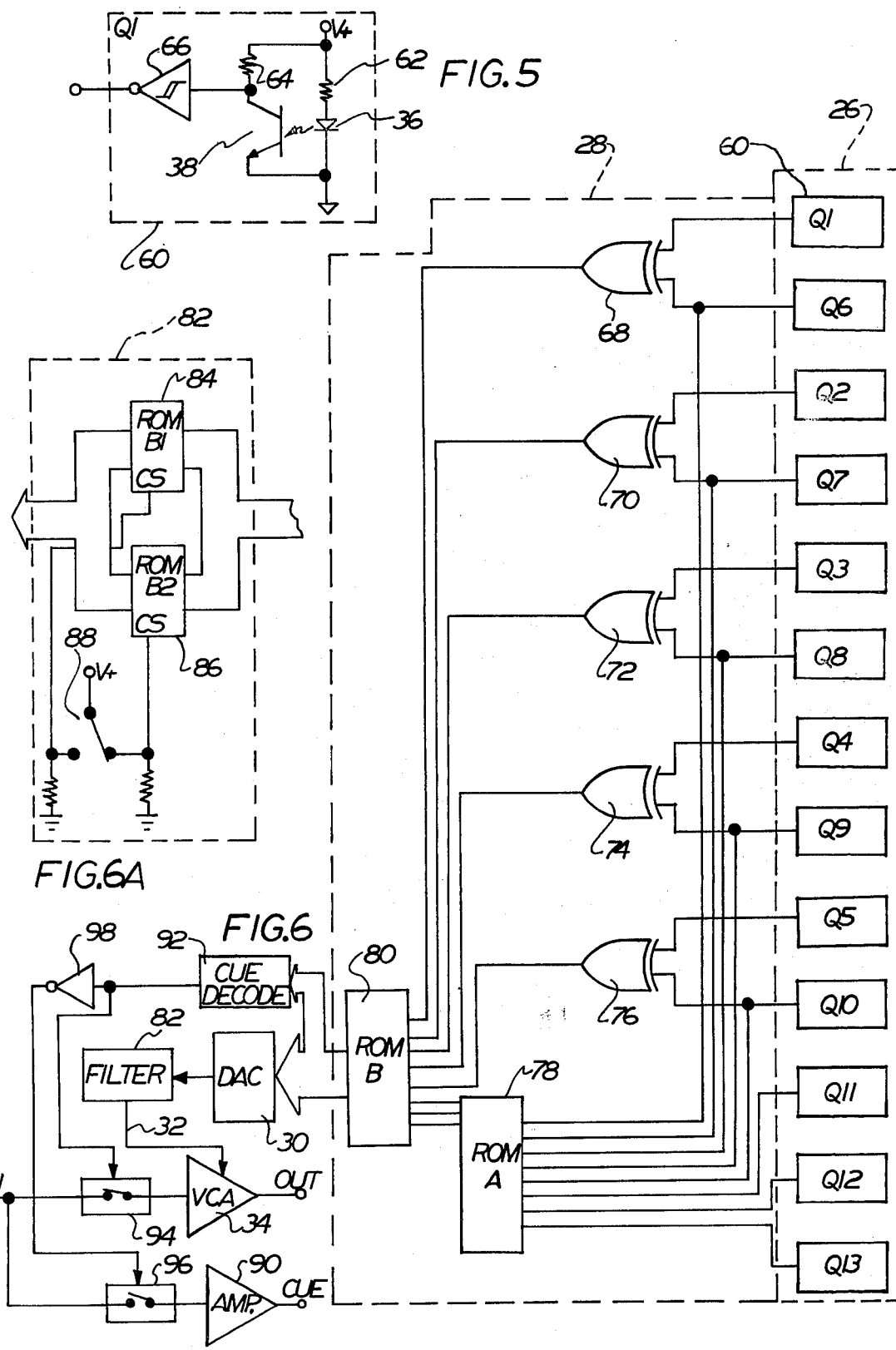

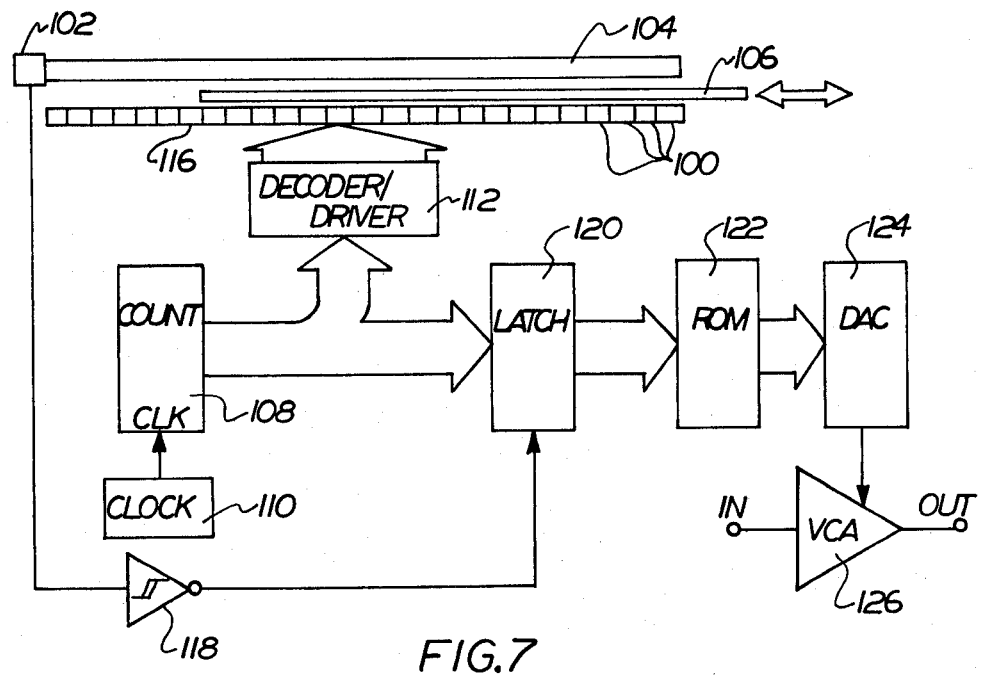
FIG. 7
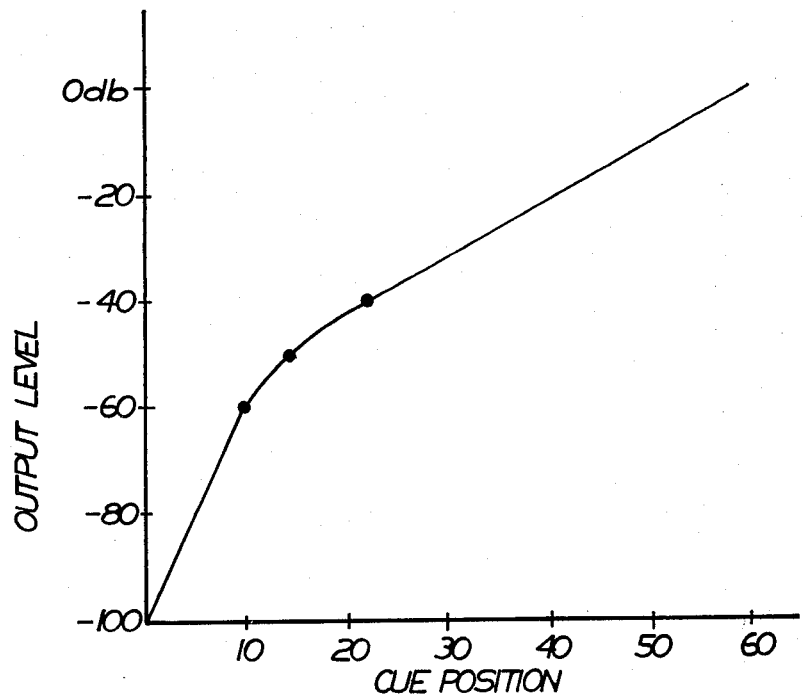
FIG. 8    ATTENUATION CURVE

APPARATUS FOR CONTROLLING AN OPERATIONAL CHARACTERISTIC OF A CONTROLLED DEVICE IN ACCORDANCE WITH THE POSITION OF A MOVABLE MEMBER

BACKGROUND AND FIELD OF THE INVENTION

The present invention relates to apparatus for controlling an operational characteristic of a controlled device, e.g., the grain of a variable gain amplifier, in accordance with the position of a movable member, e.g., a manually adjustable control level. There is disclosed herein apparatus for using radiant energy to detect the position of the movable member, for applying the resulting position indicating signal to a device which generates another signal having a value indicative of the value assigned to that particular position of the movable member, and for then applying this representative signal to the controlled device for controlling its characteristic.

In the past, it has been common to control the operational characteristics of a controlled device in accordance with the position of a movable member by connecting the movable member to either a linear or rotary potentiometer, whereby movement of the movable member changed the setting of the potentiometer. The signal derived from the wiper arm of the potentiometer was then be applied to the controlled device for controlling the operational characteristic of interest. One example of such an application is the fader control commonly employed in audio consoles. In the past, these fader controls have consisted of a linear potentiometer whose settling was controlled by the operator. The voltage signal derived at the wiper arm of the potentiometer was applied to a voltage controlled amplifier (VCA) for controlling its gain.

Potentiometers, however, tend to wear with time, eventually becoming so electrically "noisy", that replacement is required. Further, there is a period of gradual deterioration between the time of first use and the time that replacement is mandated. It would be desirable to provide some manner of controlling the operational characteristic of the controlled device which avoided this operational degradation with time, preferably maintaining quiet operation indefinitely.

Conventionally, the signal used to control the operational characteristic of the controlled device was directly derived from the wiper arm of the potentiometer. The fashion in which the control voltage varied with the position of the movable member could be altered by changing the taper of the potentiometer, the response characteristics of the controlled device, or the manner of interconnection between the manually movable lever and the potentiometer. It would be desirable to provide some method of controlling a device in accordance with the position of the movable member, wherein the relationship between the position of the movable member and the controlled characteristic could be varied in a more simple and convenient manner.

SUMMARY OF THE INVENTION

It is a general object of the present invention to provide improved apparatus for controlling a device in accordance with the position of the movable member.

It is another object of the present invention to provide improved control apparatus where the control function does not deteriorate with time.

It is still another object of the present invention to provide such apparatus which is characterized by quiet operation both initially and after extended operation.

It is yet another object of the present invention to provide apparatus for controlling the operational characteristic of a controlled device in accordance with the position of the movable member, where the relationship between the position of the movable member and the control characteristic can be easily and conveniently changed.

It is a more specific object of the present invention to provide a fader control for controlling the gain of an audio signal, wherein operation of the fader introduces little noise into the audio signal whose gain is being controlled.

It is still another object of the present invention to provide a fader control wherein the position of a manually controlled fader lever is optically detected, and the position thus detected is used to control the gain of an audio amplifier.

It is another object of the present invention to provide a fader control wherein the relationship between the position of the fader lever and the gain of the audio amplifier may be easily and conveniently changed.

In accordance with the present invention, apparatus is provided comprising a movable member, means for providing a first electrical signal indicating the position of the movable member, and means responsive to the first electrical signal for providing a second electrical signal representing a value assigned to the position indicated by the first electrical signal, whereby the value assigned to different positions of the movable member may be changed by changing the second electrical signal providing means.

In accordance with another aspect of the present invention, apparatus is provided comprising an amplifier, a manually movable member, means for optically sensing the location of the member and for providing an electrical signal representative of the sensed location, and means for controlling the gain of the amplifier in accordance with the electrical signal.

BRIEF DESCRIPTION OF THE DRAWINGS

The foregoing and other objects and advantages of the present invention will become more readily apparent from the following detailed description, as taken in conjunction with the accompanying drawings, wherein:

FIG. 1 is a schematic of a prior art fader control;

FIG. 2 is a broad block diagram of an improved fader control in accordance with the teachings of the present invention;

FIG. 3 is a front elevation view of the fader control illustrating the relative orientations of the shutter and the optical elements used to detect the location of the movable lever;

FIG. 4 is a side elevation view of a portion of the fader control, showing the relative positions of the optical elements utilized to detect the position of the shutter;

FIG. 5 is a schematic representation of one embodiment of electrical circuitry associated with the optical position sensing elements;

FIGS. 6 and 6A are schematics of a circuit for translating the optical element outputs into positional value signals;

FIG. 7 is a block diagram of a second embodiment of the present invention utilizing a different method of optically sensing the position of the movable member; and FIG. 8 is a graph of the attenuation curve produced by the decribed embodiment.

DETAILED DESCRIPTION

A prior art audio fader is schematically represented in FIG. 1. In this form of prior art audio fader, the audio signal is supplied to an input 12 of a voltage controlled amplifier 14. The voltage controlled amplifier 14 amplifies the audio signal to an extent which varies in accordance with the voltage applied to a gain control input 16 thereof, and provides the resulting amplified audio signal on an output 18. The control signal applied to the control input 16 of the voltage controlled amplifier 14 is derived from the wiper arm 20 of a potentiometer 22. The potentiometer 22, which is generally a linear potentiometer, is connected across a voltage supply having a magnitude representing the range over which it is desired to vary the control signal applied to the control input 16 of the voltage controlled amplifier.

Conventionally, the potentiometer 22 will have its wiper arm 20 directly coupled to a fader control lever. In order to vary the gain of the audio signal, the operator will manually adjust the position of the slider or other member coupled to the wiper arm 20 of the potentiometer 22, thereby adjusting the gain control voltage applied to the gain control input of the voltage controlled amplifier 14.

The sliding contact between the wiper arm 20 and the potentiometer 22 introduces noise into the gain control signal provided at the wiper arm 20. Furthermore, as the potentiometer wears, the level of noise introduced thereby will gradually increase. The noise produced by the potentiometer 22 will be multiplicatively combined with the audio signal by the voltage controlled amplifier 14. Consequently, the gain control operation introduces a noise component into the audio signal.

In accordance with the teachings of the present invention, an improved fader control is provided. In the fader control which will now be described, the position of the movable member is optically sensed and the optically detected position indication is translated into an indication representative of the value associated with the position thus detected. The gain of the audio signal is then adjusted in accordance with the value indication thus provided. Since the location of the movable member is optically sensed, the noise problems introduced by mechanical sliding electrical contacts are avoided. Since value/position translation is performed separately of position detection, the translation circuit may be designed so as to be readily changed without changing the position detection circuit.

An overall block diagram of a system in accordance with the teachings of the present invention is illustrated in FIG. 2. The manually movable member is coupled, either directly or through a suitable gearing arrangement, to a shutter 24 such that movement of the shutter is effected by movement of the movable member. The position of the shutter therefore indicates the position of the movable member to which it is coupled. The position of the shutter is optically detected by a position detecting circuit 26. The position detector 26 includes optical emitter and detector elements which are disposed along the path of movement of the shutter 24. When the shutter 24 is moved to different positions, different combinations of the light paths between the optical detectors and emitters will be blocked. The outputs of the various optical detectors is therefore representative of the position of the shutter 24.

The electrical signals provided at the outputs of the various optical detectors are provided to a translation circuit 28 which converts the signals thus provided into electrical signals representative of the value associated with the shutter position indicated by the outputs of the position detector. These value-indicating signals are provided to a controlled device 29 for use in controlling an operational characteristic of the device.

In FIG. 2 the controlled device is a digitally controlled amplifier which amplifies an audio signal provided by an audio source 31 to provide an amplified audio signal to an output device 33, such as a radio transmitter, tape recorder, speaker, etc. A digital-to-analog converter 30 is included for converting the digital signal provided by the translator circuit 28 into an analog signal. The analog signal generated by convertor 30 is provided at an output 32 which is connected to the gain control input of a voltage controlled amplifier 34. The gain of the voltage controlled amplifier (VCA) is therefore directly controlled by the output of the digital-to-analog converter 30. The VCA 34 responds to the audio signal provided by source 31 and provides the resulting amplified signal to the output device 33.

Through the arrangement of FIG. 2, the gain of the voltage controlled amplifier 34 will depend upon the position of the shutter 24. The actual relationship between the gain of the voltage controlled amplifier 34 and the position of the movable shutter 24 will be set by the translation circuit 28 since it is this circuit which translates the output of the position detector 26 into particular gain values. In one embodiment the translation circuit 28 may be configured to provide digital output signals whose binary values linearly change with position of the shutter 24. In this event, the gain of voltage controlled amplifier 34 will be linearly related to the position of the shutter 24. Presuming that the manually movable slider is directly connected to the shutter 24, the relationship between the position of the manually movable member and the gain of the voltage control amplifier will therefore similarly be linear. This relationship may be readily changed by simply substituting a different translation circuit, reflecting the substitution of different values for the respective locations of the movable shutter 24. A translation circuit 28 may be utilized, for example, which provides a logarithmic relationship between the position of the movable shutter 24 and the gain of the voltage control amplifier 34, thereby providing an "audio taper" fader.

The translation circuit 28 may be designed to selectably provide several sets of values, with the particular set being used at a given time being selectable by the operator, as by a switch 35. A particular amplifier gain versus shutter position relationship could then be easily selected by merely setting the switch 35 into the appropriate position.

The optical position detector of FIG. 2 does not rely on mechanical contact between elements thereof for establishing the position detection operation. Instead, a shutter and light beam operation is employed which is essentially immune to the wear problems associated with the prior art approach of FIG. 1. Furthermore, the bulk of the signal processing may be accomplished with digital circuitry, permitting low noise operation.

The shutter 24 and position detector 26 may take many different forms. A preferred embodiment of such an optical displacement transducer, however, is illustrated in FIGS. 3 and 4, which are respectively front and side elevation views of the detector showing the preferred configuration of the optical shutter 24 and the associated optical elements. As can best be seen in FIG. 3, the various light emitters 36 and detectors 38 are disposed on opposite sides of the shutter 24, in horizontal and vertical alignment with one another whereby each detector 38 is disposed in the path of the beam produced by its associated emitter 36. The output state of each detector 38 is therefore dependent upon whether the shutter 24 is blocking the light path between that detector and its associated emitter. Preferably, the light emitters will be infrared light emitting diodes, and the detectors 38 will be selected to have infrared sensitivity characteristics matching the emission characteristics of the emitters. The use of emitters and detectors which operate on the infrared frequency range reduces the susceptibility of the position detector to false outputs caused by ordinary room illumination leaking into the detectors.

The shutter 24 will be designed to travel in a path skewed (preferably perpendicular) to the optical lines joining the various emitters 36 and associated detectors 38. The shutter 24 includes a tab 39 which projects through a slot in the panel 40 to which the shutter and position detector assembly are fastened. A knob 42 is mounted on the tab so as to permit the operator to slide the shutter back and forth along the slot within which the tab rides. The shutter 24 also has two ridges 44 protruding from the opposite sides thereof. These ridges 44 are captured in corresponding slots in two parallel rails 46 fastened to the panel 40 adjacent the longitudinal slot within which the shutter 24 rides. These rails 46 cooperate with the projecting ridges 44 to confine and guide the shutter 24. The shutter 24 will, of course, be constructed of a material which is opaque at the light frequencies emitted by the emitters 36.

Printed circuit board assemblies 48 and 50 are affixed to the rails 46, and respectively carry the detectors 38 and emitters 36. The emitter/detector pairs are carried in two parallel levels. The arrangement of the emitter/detector pairs along the path of travel of the shutter 24 is different in these two levels, as is the configuration of the shutter. The actual arrangement of emitters and configuration of the shutter 24 can best be seen in FIG. 4.

For clarity, the optical shutter 24 is shown in dotted lines in FIG. 4. The shutter 24 has a comb-like appearance, having a solid backbone 52 aligned with the upper row of emitter/detector pairs, and three downward projecting teeth 54 which protrude into the optical paths of the emitter/detector pairs in the lower row. The two end teeth 54 and 58 each have one edge aligned with the corresponding edge of the backbone 52. The central tooth is spaced midway between the two end teeth 54 and 58. The three teeth have widths which are essentially equal, and are the same as the width of the gaps separating the teeth.

The lower row of emitter elements consists of ten emitters, arranged in two groups of five. The five emitters of each group are disposed immediately adjacent one another, and the two groups are separated by a distance corresponding to the total width of the shutter 24. Consequently, the shutter 24 may be disposed in an intermediate position wherein it will not block the light paths associated with any of the emitter/detector pairs in the lower level, but a movement in either direction by an increment corresponding to the width of one of the optical emitters will result in the shutter 24 blocking an emitter of one of the two groups.

The top row of emitters consists of three emitters. The center one is disposed equidistant from the two groups of five in the lower row, and the other two in the upper row are disposed generally midway between the center one and the end of the row.

As stated previously, each emitter will have an associated detector disposed in alignment on the opposite side of the shutter. There are therefore 13 detectors mounted on printed circuit board 48 arranged the same as the emitters on printed circuit board 50.

The spacing of the emitters in the preferred embodiment is given more particularly in the following table, wherein the origin is defined as the optical axis of the rightmost emitter in the lower row (as seen in FIG. 4), and one unit of distance is defined as the distance between optical axes of adjacent emitters in the lower row.

| Pair No. (Q) | Row | Position Distance from Orgin |
| --- | --- | --- |
| 1 | lower | 0 |
| 2 | lower | 1 |
| 3 | lower | 2 |
| 4 | lower | 3 |
| 5 | lower | 4 |
| 6 | lower | 30 |
| 7 | lower | 31 |
| 8 | lower | 32 |
| 9 | lower | 33 |
| 10 | lower | 34 |
| 11 | upper | 8.5 |
| 12 | upper | 17.5 |
| 13 | upper | 26.5 |

The shutter is 25 units long, and its three teeth are each five units wide and are separated by a gap of five units.

As the shutter is moved back and forth, it will occlude different combinations of the light emitters 36. There are 66 unique combinations of shutter occlusions, representing 66 different resolvable positions of the shutter 24. Most resolvable positions are spaced from the adjacent resolvable position by one unit, although six positions represent intermediate, half-unit positions. The sixty-six possible positions range from the "cue" position P=1 (entire shutter right of Q1, all emitters uncovered) to P=60 (right edge of shutter blocking Q10, all others uncovered). It is notable that the unique arrangement shown in FIG. 4 permits resolution of positions over a range which is more than twice the length of the shutter 24. The optical position encoding arrangement is therefore relatively compact.

FIG. 5 shows the circuitry associated with each emitter/detector pair. In FIG. 5, the light emitter is shown as a light emitting diode 36 coupled across a +V supply through a current limiting resistor 62 so as to be continuously turned on. The detector element 38 is shown in FIG. 5 as an NPN phototransistor having its collector-emitter current path connected in series with a load resistor 64 across the +V supply.

Since the phototransistor 38 is mounted along the optical axis of the light emitting diode 36, the light emitting diode 36 illuminates the phototransistor 38 except when the optical path is blocked by the shutter.

When illuminated, the phototransistor 38 will be in a low impedance state whereby the voltage at its collector will be low. When the shutter blocks the light path between the light emitting diode 36 and the phototransistor 38, however, the phototransistor 38 will be in a high impedance state, whereby the voltage at its collector will be close to the +V supply voltage.

A Schmitt trigger inverter 66 has its input connected to the collector of the phototransistor 38 to sense the voltage at its collector, and thereby sense whether or not the optical path between the light emitting diode 36 and the phototransistor 38 is blocked by the shutter. The inverter 66 has a very high input impedance and a low output impedance and serves as a buffer for the output of the phototransistor 38.

The output of the inverter 66 represents the output of the emitter/detector circuit 60. This output is a binary signal, having one of two levels, depending upon whether or not the shutter is occluding the associated emitter. When the shutter is blocking the light path the signal at the output of the inverter 66 is at a low logic level. When the path between the emitter 36 and the detector 38 is clear, however, the signal at the output of the inverter 66 is at a high logic level. Since there are thirteen emitter/detector pairs, there will be thirteen digital signals whose values collectively identify the location of the shutter over the range of 66 possible positions.

The translation circuit 28 responds to these thirteen digital signals to provide a digital signal having a binary-coded value representative of the value assigned to the position indicated by the present state of those thirteen signals. The presently preferred form of the translation circuitry 28 is shown in FIG. 6. In FIG. 6, the translation circuit 28 is shown as consisting of an intermediate address translating circuit including five exclusive-OR gates 68-76 and a solid state read-only memory (ROM) 78. The purpose of these elements is to convert the thirteen digital signals provided by the thirteen emitter/detector pairs into an eight bit address which can be used to address a second solid state ROM 80 containing the values assigned to the various resolvable positions.

Returning, momentarily to FIG. 4, it will be recalled that the emitters located in the lower row are consolidated into two groups of five, where the two groups are separated by a distance greater than the total length of the shutter 24. Because of this, at least one of the groups of five will be totally uncovered at any given time. The outputs of the two groups may therefore be combined without loss of information. The exclusive OR gates 68-76 associated with the translation circuitry 28 shown in FIG. 6 each combine the outputs of corresponding detectors in the two groups to provide a single bit output. Thus, the output of the first detector (Q1) of the righthand group of five and the output of the first detector (Q6) of the lefthand group of five are provided to respective inputs of the exclusive OR gate 68. Similarly, the outputs of the second detectors (Q2, Q7) of each group are joined by exclusive OR gate 70, the third (Q3, Q8) by exclusive OR gate 72, etc.

If the shutter is positioned so that all the emitters in the lower row are uncovered, the outputs of Q1–Q10 will be all "1"s and the outputs of the exclusive-OR gates 68-76 will be all "0"s. If, on the other hand, the shutter is positioned to block one or more of the emitters in the lower row, the outputs of these five exclusive OR gates 68-76 will be the logic inverse of the outputs of whichever of the groups of five emitter/detector pairs is partially or wholly blocked by the shutter 24. For example, when the shutter is located in the position shown in FIG. 4, the outputs of Q1–Q5 will be "10000". The outputs of the exclusive-OR gates 68-76 will therefore be "01111". Since the outputs of the exclusive OR gates 68-76 represent the combined outputs of both groups of five emitter/detector pairs in the lower row, it is necessary to distinguish between the two possible origins of these signals, i.e., the leftward group of five or the rightward group of five. In the FIG. 6 embodiment, a read only memory (ROM) 78 is used to perform this function.

ROM 78 is a solid state memory having a number of words stored at addressable locations therein. Each three bit word may be viewed as represented a particular "coarse" position of the shutter 24. ROM 78 is addressed not only by the five outputs of one of the groups of five (in the FIG. 6 embodiment, the leftward group) but also by the outputs of the three emitter/detector pairs in the upper row (Q11–Q13). ROM 78 responds to this eight bit address by recalling and providing at its output a three bit output signal, representing the "coarse" shutter location identified by that address. The three bits provided at the output of ROM 78 and the five outputs of the exclusive OR gates 68-76 (which may be viewed as representing the "fine" position of the shutter 24) form a position-indicating byte having a unique binary value for each of the 66 resolvable positions of shutter 24.

The position-indicating byte is applied to the address inputs to a second ROM 80. ROM 80 has a plurality of addressable locations therein, each storing an eight-bit byte having a binary value assigned to the shutter location defined by the position-indicating byte addressing that location. ROM 80 responds to the position-indicating byte by providing at its output a digital signal representing the value assigned to the specific shutter location identified thereby. As in the FIG. 2 embodiment, the output of the translating circuit 28 is provided to a digital-to-analog converter 30. In FIG. 6, a filter 82 is included between the digital-to-analog converter 30 and the voltage controlled amplifier 34. Filter 82 smooths the transitions occurring in the output of converter 30.

The contents of the two solid state ROMs 78 and 80 are listed in appendix A set forth hereinafter. With the values set forth therein, the relationship between the digital signals provided at the output of the second solid state READ only memory 80 and the position of the shutter 24 is nonlinear, producing the attenuation vs. shutter position curve shown in FIG. 8. This relationship may be changed in any desired fashion by simply replacing the ROM 80 with another ROM having different values stored therein for the various unique positions of the shutter 24.

Position 2 represents the lowest amplifier gain setting (00). Position 1 represents a "cue" position where the input is disconnected from the VCA and instead applied to a cue amplifier 90. The switching of the input signal between amplifiers 34 and 90 is controlled by a cue decoder 92 which monitors the output of the ROM 80. The cue decoder includes logic elements arranged to recognize the unique digital word (01) associated with the cue position. The output of the cue decoder controls two solid state switching circuits 94 and 96 (although shown in FIG. 6, for convenience, as two SPST switches, they are preferably conventional solid state switches).

The state of each switch (open or closed) depends upon the logic state of the applied control signal. The output of the cue decoder 92 directly controls switch 94. The logic inverse of the cue decoder output, as provided by an inverter 98, controls switch 96. Since the logic states of the control signals applied to switches 94 and 96 are the inverse of one another, the states of the two switches are also the inverse of one another. When the slider is not in the cue position, the decoder output is at a logic "1" state, whereby switch 94 is closed and switch 96 open. The input is then applied to the voltage controlled amplifier 34. When the slider is in the cue position the decoder 92 recognizes the unique "cue" word appearing at the output of ROM 80 and provides a logic "0" at its output. This causes switch 94 to open and switch 96 to close. The applied input signal is thus removed from amplifier 34 and applied instead to cue amplifier 90. Switching of the applied signal between the voltage controlled amplifier 34 and the cue amplifier 90 is therefore accomplished electronically, that is, entirely without any mechanical switching elements.

As stated previously, the translator circuit may provide several selectable gain/position relationships. FIG. 6A is a variation of the FIG. 6 translator designed to implement this selection function. In the FIG. 6A variation, the ROM 82 is represented by two ROMS 84 and 86 connected in parallel. The ROMs 84 and 86 have different values stored in them, representing two different gain/position relatinships. The operator may select one of the two ROMs, and thus one of the two relationships, via a switch 88. SPDT switch 88 has its toggle arm connected to a +V supply and its two contacts connected to the chip select (CS) inputs to the ROMs 84 and 86 such that either ROM may be selected by setting switch 88 appropriately. The ROMs 84 and 86 are of the type which essentially open circuit their outputs when not selected. This approach could easily be extended to provide the circuit with three or more selectable relationships.

As an alternative, the ROM 80 could be replaced by a random-access memory (RAM) loaded with values from some external source (e.g., a microcomputer). The gain relationship could then be easily changed by loading the RAM with a different set of values. The same circuit could thus be provided with innumerable different gain relationships.

FIG. 7 is a block diagram of a second embodiment of a fader control circuit in accordance with the teachings of the present invention. In this embodiment, the two row pattern of thirteen emitter/detector pairs is replaced by a linear array of light sources 100 opposed to a single light detector arrangement. In this embodiment, the detector arrangement includes only a single phototransistor detector element 102 optically coupled to the end of a light pipe 104. The light pipe 104, which may be formed of any switchable plastic or glass, is disposed parallel to the linear array of light sources 100 so that the light emitted by any of these light sources 100 will be collected by the light pipe 104 and directed to the detector 102. A shutter 106 is again included for selectively blocking the light path between selected ones of the light sources 100 and the light pipe 104. In this embodiment, the shutter 106 has a simple rectangular shape.

The position of the shutter 106 is determined by sequentially illuminating the light sources, beginning at the far right, and monitoring the output of the detector 102. In the FIG. 7 embodiment, the sequential activation of the light sources 100 is accomplished by a counter 108 which is clocked by clock pulses provided from a regular clock source 110. The output of counter 108 is decoded by a decoder/driver circuit 112. At the beginning of the scanning cycle the count contained within the counter 108 will be zero, and the decoder/driver 112 will illuminate none of the individual light sources 100. With the next regular occurring clock pulse provided by the clock source 110 the count contained with the counter 108 will increment to a value of 1, causing the decoder/driver 112 to illuminate the rightmost light source, as viewed again in FIG. 7. With each successive clock pulse, the counter will increment the count stored therein by 1 and the decoder/driver 112 will illuminate the next successive light source (only one light source is illuminated at any given time). This scanning of the light sources will continue until the last light source has been turned on. With the next clock pulse the counter will overflow, returning to a count of zero. The scanning will thus begin a new cycle.

The position of the shutter is determined by detecting when in the scanning the detector 102 first detects light. In the example shown in FIG. 7, the shutter is positioned such that the light source 116 is the first light source not occluded by the shutter. When this light source 116 is turned on, the light produced thereby will be directed to the detector 102 by the light pipe 104, causing the output of the detector 102 to shift to a high logic level from a low logic level. a Schmitt trigger inverter 118 buffers and sharpens the output of the detector 102. When the detector output shifts from a normal low logic level towards a higher level, the output of the inverter will in turn shift from a high logic level to a low logic level.

The falling edge transistion on the inverter output 118 causes a digital latch circuit 120 to latch therein the count currently being provided at the output of the counter 108. The count stored within the latch circuit 120 identifies light source 116 and therefore corresponds to the present position of the shutter 106. As in the previous embodiment, this position indicating digital signal is provided to the address input of a ROM 122, which has stored therein values assigned to the respective locations of the shutter 106. The ROM circuit 122 responds to the address provided by the latch circuit 120 to provide at its output the value assigned to the shutter location which corresponds to that address. This value, in the form of a digital word, is provided to a digital-to-analog converter 124, which converts it into an analog signal having a level representative of the value assigned to that shutter position. The analog output of digital-to-analog converter circuit 124 is directed to the gain control input of a voltage controlled amplifier 126, and controls the gain thereof. Of course, the filtering and cue amplifier switching of the FIG. 6 embodiment may also be applied to the FIG. 7 embodiment.

Thus, to summarize, the counter 108 will begin at a count of zero, and will increment this count with each clock pulse provided by the clock circuit 110. The decoder/driver circuit 112 decodes the count provided at the output of the counter 108 and turns on the corresponding emitter 100. As the count increments, the position of the emitter which is turned on moves from right to left, eventually reaching a stage 116 which is not blocked by the shutter 106. When this occurs, the output of the comparator 118 will shift from a high logic level to a low logic level, causing a latch circuit 120 to latch the current contents of the counter 108 therein. The count thereby latched into the latch circuit 120 identifies the emitter 116, and thereby indicates the position of the shutter 106. This position-indicating signal is translated into a value-indicating signal by the ROM 122, which provides the value indicating signal to the digital-to-analog converter 124. The analog output of the digitial-to-analog converter controls the voltage controlled amplifier 126, whereby the gain of the voltage controlled amplifier is directly controlled by the position of the shutter element 106.

The counter 108 will continue to increment beyond the count corresponding to the stage 116 at which the latch circuit 120 was triggered, eventually reaching the end of the linear array of emitters 100. As mentioned previously, the counter 108 will preferably be configured to overflow at this value, thereby automatically returning to a zero state and beginning the scanning anew. Since the scanning of the emitters 100 will take place on a continuous basis, the position of the shutter 106, as indicated by the contents of the latch circuit 120, will be continuously updated.

Although the invention has been described with respect to a preferred embodiment, it will be appreciated that various rearrangements and alterations of parts may be made without departing from the spirit and scope of the present invention, as defined in the appended claims.

electrical signal, said second electrical signal providing means comprising a solid state memory having said assigned values stored at addressable locations therein, said memory being addressed by said first electrical signal to provide said second electrical signal in accordance with said stored assigned values, whereby the values assigned to different positions of said movable member may be changed by changing said solid state memory or the values stored therein.

2. Apparatus as set forth in claim 1, wherein said first electrical signal providing means comprises means for nonmechanically sensing the location of said movable member and for providing said first electrical signal in accordance with said sensed location.

3. Apparatus as set forth in claim 1, and further comprising means having a controllable operational characteristic and responsive to said second electrical signal for controlling said operational characteristic in accordance with the value of said second electrical signal.

4. Apparatus as set forth in claim 1, wherein said means for providing said first electrical signal comprises means for providing a first multibit digital signal indicating the position of said movable member, and wherein said second electrical signal providing means comprises digital means responsive to said first multibit digital signal to provide a second multibit digital signal

APPENDIX A*

| POS | ROM B ADR | ROM B DATA | ROM A ADR | ROM A DATA | POS | ROM B ADR | ROM B DATA | ROM A ADR | ROM A DATA |
|---|---|---|---|---|---|---|---|---|---|
| 1 | 00 | 01 | FF | 00 | 31 | 60 | B5 | 1F | 03 |
| 2 | 01 | 00 | FF | 00 | 32 | 61 | B7 | 1E | 03 |
| 3 | 03 | 19 | FF | 00 | 33 | 63 | BA | 1C | 03 |
| 4 | 07 | 32 | FF | 00 | 34 | 67 | BC | 18 | 03 |
| 5 | 0F | 3F | FF | 00 | 35 | 6F | BF | 10 | 03 |
| 6 | 1F | 4C | FF | 00 | 35.5 | 8F | BF | 30 | 04 |
| 7 | 1E | 54 | FF | 00 | 36 | 9F | C2 | 20 | 04 |
| 8 | 1C | 5D | FF | 00 | 37 | 9E | C4 | 21 | 04 |
| 9 | 18 | 65 | FF | 00 | 38 | 9C | C7 | 23 | 04 |
| 10 | 10 | 6D | FF | 00 | 39 | 98 | C9 | 27 | 04 |
| 10.5 | 30 | 6D | DF | 01 | 40 | 90 | CC | 2F | 04 |
| 11 | 20 | 73 | DF | 01 | 41 | 80 | CE | 3F | 04 |
| 12 | 21 | 79 | DF | 01 | 42 | 81 | D0 | 3E | 04 |
| 13 | 23 | 7F | DF | 01 | 43 | 83 | D3 | 3C | 04 |
| 14 | 27 | 84 | DF | 01 | 44 | 87 | D6 | 38 | 04 |
| 15 | 2F | 88 | DF | 01 | 44.5 | A7 | D6 | 78 | 05 |
| 16 | 3F | 8C | DF | 01 | 45 | AF | D9 | 70 | 05 |
| 17 | 3E | 8F | DF | 01 | 46 | BF | DB | 60 | 05 |
| 18 | 3C | 93 | DF | 01 | 47 | BE | DE | 61 | 05 |
| 19 | 38 | 95 | DF | 01 | 48 | BC | E0 | 63 | 05 |
| 19.5 | 58 | 95 | 9F | 02 | 49 | B8 | E3 | 67 | 05 |
| 20 | 50 | 99 | 9F | 02 | 50 | B0 | E5 | 6F | 05 |
| 21 | 40 | 9B | 9F | 02 | 51 | A0 | E8 | 7F | 05 |
| 22 | 41 | 9E | 9F | 02 | 52 | A1 | EB | 7E | 05 |
| 23 | 43 | A0 | 9F | 02 | 53 | A3 | ED | 7C | 05 |
| 24 | 47 | A3 | 9F | 02 | 53.5 | C3 | ED | FC | 06 |
| 25 | 4F | A5 | 9F | 02 | 54 | C7 | F0 | F8 | 06 |
| 26 | 5F | A8 | 9F | 02 | 55 | CF | F2 | F0 | 06 |
| 27 | 5E | AB | 9F | 02 | 56 | DF | F5 | E0 | 06 |
| 28 | 5C | AD | 9F | 02 | 57 | DE | F7 | E1 | 06 |
| 28.5 | 7C | AD | 1F | 03 | 58 | DC | FA | E3 | 06 |
| 29 | 78 | B0 | 1F | 03 | 59 | D8 | FC | E7 | 06 |
| 30 | 70 | B2 | 1F | 03 | 60 | D0 | FF | EF | 06 |

*The address and data values are listed in hexadecimal notation

What is claimed is:

1. Apparatus comprising:
   a movable member;
   means for providing a first electrical signal indicating the position of said movable member; and
   means responsive to said first electrical signal for providing a second electrical signal representing a value assigned to the position indicated by said first serving as said second electrical signal.

5. Apparatus as set forth in claim 1, wherein said first electrical signal providing means comprises emitting means for emitting radiant energy, detecting means for detecting radiant energy and providing an output indicative thereof, said detecting means being disposed in the path of said radiant energy emitted by said radiant energy emitting means, shutter means coupled to said movable member for selectively blocking said radiant energy path between said emitting means and said detecting means in accordance with the position of said movable member whereby said detecting means output also varies in accordance with said position of said movable member, and means responsive to said detector output for providing said first electrical signal.

6. Apparatus as set forth in claim 1 wherein said second electrical signal providing means comprises first means for providing a control signal and second means responsive to said first electrical signal for providing a selected one of at least two second signals in accordance with said control signal, whereby the values assigned different positions of said movable member may be changed by changing said control signal.

7. Apparatus as set forth in claim 6 wherein said first means comprises switch means manually controllable to provide a selected one of at least two different control signals.

8. Apparatus comprising:
a movable member;
means for providing a first electrical signal indicating the position of said movable member;
means responsive to said first electrical signal for providing a second electrical signal representing a value assigned to the position indicated by said first electrical signal;
variable gain amplifier means having a gain control input, wherein the gain of said variable gain amplifier means is dependent upon the value of the signal applied to said gain control input; and
means for providing said second electrical signal to said gain control input of said variable gain amplifier means whereby said gain of said amplifier means varies in accordance with the location of said movable member, and whereby the amplifier gain values assigned to different positions of said movable member may be changed by changing said second electrical signal providing means.

9. Apparatus as set forth in claim 8 wherein said second electrical signal providing means comprises first means for providing a control signal and second means responsive to said first electrical signal for providing a selected one of at least two second signals in accordance with said control signal, whereby the relationship between the gain of said amplifier means and the location of said movable member may be changed by changing said control signal.

10. Apparatus as set forth in claim 9 wherein said first means comprises switch means manually controllable to provide a selected one of at least two said control signals.

11. Apparatus comprising:
an amplifier;
a manually movable member;
means utilizing radiant energy for sensing the location of said member and for providing an electrical signal representative of said sensed location; and
means for controlling the gain of said amplifier in accordance with said location signal, said gain controlling means including first means for providing a control signal and second means responsive to both said location signal and said control signal for providing a gain signal representing an amplifier gain value assigned to the position indicated by said location signal, and means for controlling the gain of said amplifier in accordance with said gain signal, whereby the relationship between the location of said movable member and the gain of said amplifier may be changed by changing said control signal.

12. Apparatus as set forth in claim 11, wherein said means for controlling the gain of said amplifier in accordance with said electrical signal comprises means responsive to said location representative electrical signal for providing an electrical signal representing a value assigned to the position indicated by said location representative electrical signal, and means for controlling the gain of said amplifier in accordance with said value representative electrical signal.

13. Apparatus comprising:
an amplifier;
a manually movable member;
means utilizing radiant energy for sensing the location of said member and for providing an electrical signal representative of said sensed location; and
means for controlling the gain of said amplifier in accordance with said electrical signal;
wherein said radiant energy utilizing means comprises emitting means for emitting radiant energy, detecting means for detecting said emitted radiant energy and providing an output indicative thereof, shutter means coupled to said movable member for selectively blocking said radiant energy emitted by said emitting means in accordance with the position of said movable member, and means responsive to said detector output for providing said electrical signal.

14. Apparatus as set forth in claim 13 wherein said emitting means comprises means for moving the source of said emitted radiant energy along the side of the path of movement of said shutter, and wherein said detector means comprises means for detecting the location of said shutter by detecting when during said source movement said source of radiant energy is blocked by said shutter.

15. Apparatus as set forth in claim 14 wherein said means for detecting comprises a single radiant energy detector, and radiant energy collector means disposed along said path of shutter movement opposed to said side along which said radiant energy source moves for collecting emitted radiant energy not blocked by said shutter, whatever the location of said source, and for directing said collected radiant energy to said single radiant energy detector.

16. Apparatus as set forth in claim 15 wherein said radiant energy collector means comprises a light pipe having said single radiant energy detector coupled to one end thereof.

17. Apparatus as set forth in claim 14 wherein said means for moving the source of said emitted radiant energy comprises a plurality of radiant energy emitters disposed at various positions along the side of the path of movement of said shutter, and means for sequentially applying power to selected ones of said emitters, whereby said source of radiant energy changes, effectively moving said source along said shutter path.

18. Apparatus comprising:
an amplifier;
a manually movable member;
means utilizing radiant energy for sensing the location of said member and for providing an electrical signal representative of said sensed location;
digital memory means having a plurality of digital words stored at addressable locations therein, said digital words representing values assigned to corresponding locations of said movable member;

means for addressing said memory means in accordance with said location representative electrical signal so as to thereby select the corresponding one of said stored digital words; and means for controlling the gain of said amplifier in accordance with said digital word.

19. Apparatus for detecting the position of a movable member, comprising:

a shutter opaque to radiant energy and coupled to said movable member for movement thereby, said shutter being movable along a first path by said movable member, emitter means for emitting radiant energy and for moving the source of radiant energy along the side of the path of movement of said shutter, and detector means for detecting when in said radiant energy source movement said radiant energy is blocked by said shutter so as to thereby determine the location of said shutter, said detector means including radiant energy detecting means for detecting radiant energy, said detector having a radiant energy sensitive surface with dimensions substantially smaller than the length of said first path over which said shutter can move, and radiant energy collecting means disposed along said path of shutter movement opposed to said side along which said radiant energy source moves for collecting emitted radiant energy not blocked by said shutter, whatever the location of said source, and for directing said collected radiant energy to said radiant energy sensitive surface of said radiant energy detecting means.

20. Apparatus as set forth in claim 19 wherein said radiant energy collector means comprises a light pipe having said radiant energy detecting means coupled to one end thereof.

21. Apparatus as set forth in claim 19 wherein said detector means comprises radiant energy sensitive means providing an output having a first state when radiant energy is being detected thereby and a second state when radiant energy is not being detected thereby, and means responsive to a change in the state of the output of said radiant energy sensitive means for indicating the location of said radiant energy source at that time, said indicated location representing the location of said shutter and thus said movable member.

22. Apparatus as set forth in claim 21 wherein said emitter means includes means for providing an electrical signal whose value varies with time and means for controlling the position of said source of radiant energy in accordance with the value of said electrical signal, and wherein said means responsive to a change in the state of the output of said radiant energy sensitive means comprises means responsive to said state change for storing the value of said electrical signal at that time, said value representing said location indication.

23. Apparatus as set forth in claim 19 wherein said means for moving the source of said emitted radiant energy comprises a plurality of radiant energy emitters disposed at various positions along the side of the path of movement of said shutter, and means for sequentially applying power to selected ones of said emitters, whereby said source of radiant energy changes, effectively moving said source along said shutter path.

24. Apparatus for controlling the gain of an amplifier in accordance with the position of a manually movable member, comprising:

digital memory means having a plurality of digital words stores at addressable locations therein, said memory means being responsive to an address signal for providing the digital word addressed thereby at a memory output;

means responsive to the position of said movable member for providing a digital signal representative thereof and for addressing said digital memory therewith; and means for controlling the gain of said amplifier in accordance with said digital words provided at said memory output.

25. Apparatus as set forth in claim 24, wherein said digital memory means comprises a solid state read-only memory.

26. Apparatus as set forth in claim 24, wherein said digital memory means comprises a solid state random-access memory.

27. Apparatus as set forth in claim 24, wherein said digital memory means has at least two gain values stored therein for each position of said movable member and wherein said digital memory means is responsive to a control signal for selecting the one of said at least two signals which is to be provided at said memory output in response to said position representative digital signal.

* * * * *